United States Patent [19]
Matsushita et al.

[11] 3,914,781
[45] Oct. 21, 1975

[54] GATE CONTROLLED RECTIFIER

[75] Inventors: Takeshi Matsushita; Hiroshi Horinaga; Takaji Ohtsu; Hisao Hayashi, all of Atsugi, Japan

[73] Assignee: Sony Corporation, Tokyo, Japan

[22] Filed: June 28, 1974

[21] Appl. No.: 484,311

Related U.S. Application Data

[63] Continuation of Ser. No. 243,243, April 12, 1972, abandoned.

[30] Foreign Application Priority Data

Apr. 13, 1971 Japan .............................. 46-23301

[52] U.S. Cl. ...................... 357/38; 357/13; 357/20; 357/89

[51] Int. Cl.² ................... H01L 29/74; H01L 29/90; H01L 29/06

[58] Field of Search .................... 357/38, 20, 13, 89

[56] References Cited

UNITED STATES PATENTS

| | | | |
|---|---|---|---|
| 3,236,698 | 2/1966 | Shockley | 357/38 |
| 3,300,694 | 1/1967 | Stehney et al. | 357/38 |
| 3,341,380 | 9/1967 | Mets et al. | 357/38 |
| 3,434,023 | 3/1969 | Lesk | 357/38 |
| 3,497,776 | 2/1970 | Philips | 357/13 |
| 3,713,008 | 1/1973 | Dorendorf | 357/38 |

*Primary Examiner*—Andrew J. James
*Assistant Examiner*—Joseph E. Clawson, Jr.
*Attorney, Agent, or Firm*—Lewis H. Eslinger; Alvin Sinderbrand

[57] ABSTRACT

A semiconductor PNPN large current switching device constructed such that the PN junction of the cathode N type region and a select portion of the P gating element located directly beneath the cathode contact lead is substantially nonconductive. In a preferred embodiment this is accomplished by highly doping the select portion of the P type gating region with an impurity to lower the electron injection efficiency of the adjacent portion of the cathode N type region. In another embodiment it is accomplished by constructing the select P type portion to have a greater thickness than the remaining portion of the gating P region, and in still another embodiment both of these features are employed.

2 Claims, 17 Drawing Figures

GATE CONTROLLED RECTIFIER

This is a continuation of application Ser. No. 243,243, filed Apr. 12, 1972, now abandoned.

BACKGROUND OF THE INVENTION

The present invention relates to semiconductor devices and more particularly to PNPN semiconductors of the type capable of being switched readily between two extremes of impedance by the application of a voltage of a predetermined polarity to a single gating electrode.

Such semiconductor switching devices, commonly referred to as gate-turn-off type semiconductors (GTO) or gate controlled semiconductor switches (GCS) generally comprise a sandwich construction of a first P type region followed by an N type region followed by a second P type region and finally followed by a second N type region. For convenience these regions will hereinafter be referred to as the P1, N1, P2 and N2 regions, respectively. The P1 region constitutes the anode of the device while the N2 region constitutes the cathode of the device. The P2 region has an electrode connected to it which operates as a gate electrode.

When a positive voltage is supplied to the gate electrode and positive and negative voltages are applied to the anode and cathode, respectively, the GCS is turned on and a forward current will flow between the anode and the cathode. When a negative potential is supplied to the gate electrode the current will be turned off. One problem in such devices is that the internal resistance in the P2 portion requires an excessive reverse biasing gating current to completely turn off the N2 region. This internal resistance causes a voltage drop in the gating current which only allows the portions of the N2 region closest to the gating electrode to be reverse biased.

If the internal resistance of the P2 region is reduced by increasing the impurity density in the P2 region, the electron injection efficiency from the N2 region into the P2 region is greatly reduced. This is disadvantageous because the GCS is required to satisfy the condition that $\alpha_N + \alpha_P \approx 1$ where $\alpha_N$ and $\alpha_P$ designate the current gains of the respective N2-P2-N1 and P2-N1-P1 transistor components which can be said to make up the PNPN device. It is also possible to shape the N2 region to have narrow elements, for example in the form of a comb or a star, so that the central portion of the elements can be easily reversed biased to shut-off the GCS.

In high current carrying devices of this type however, the portion of the N2 region which is connected to the cathode lead must remain relatively large. This lead bonded portion of the N2 region cannot be effectively turned off and the device is destroyed because of the excessive current which is carried only by the N2 region below the surface of the bonded lead.

SUMMARY OF THE INVENTION

The above and other disadvantages are overcome by the present invention of a semiconductor translating device comprising a semiconductor body having successive, contiguous zones of opposite conductivity types including two end zones and a plurality of intermediate zones, external connections to each of the end zones and to a select one of the intermediate zones for the application of voltage from an external source. The select intermediate zone is directly adjacent to one of the end zones and has a select portion which is directly aligned with the external connection to the one end zone. The select portion together with a corresponding, adjacent portion of the one end zone forms a PN junction which is substantially nonconductive irrespective of the polarity of voltages applied between the electrode connected to the intermediate zone and the electrode connected to the one end zone.

In one preferred embodiment the first portion in the select intermediate zone has a predetermined impurity concentration which is substantially greater than the impurity concentration of the remaining portion of the select intermediate zone. In another embodiment the first portion of the select intermediate zone has a thickness in the direction of current flow between the end connections which is substantially greater than the thickness of the remaining portion of the select intermediate zone. In still another embodiment the first portion has both a greater impurity concentration and a greater thickness than the remaining portion of the select intermediate zone.

In all of the embodiments of the invention, since the nonconductive portion of the PN junction formed between the intermediate zone and the end zone is located directly beneath the end connection, the remaining portion of the junction may be turned off by applying a voltage of predetermined polarity and magnitude to the electrode connected to the select intermediate zone without the danger that the portion of the one end zone to which the end connection is bonded will remain conducting and be destroyed by excessive currents.

It is therefore one object of the invention to provide a PNPN switching device capable of handling large currents and which requires relatively low switching currents to become either conductive or nonconductive.

The foregoing and other objectives, features and advantages of the invention will be more readily understood upon consideration of the following detailed description of certain preferred embodiments of the invention, taken in conjunction with the accompanying drawings.

BRIEF DESCRIPTION OF THE DRAWINGS

FIGS. 1 and 1A are schematic representations of a typical four zone PNPN semiconductor device for purposes of illustration;

DESCRIPTION OF CERTAIN PREFERRED EMBODIMENTS

Figure 1A:
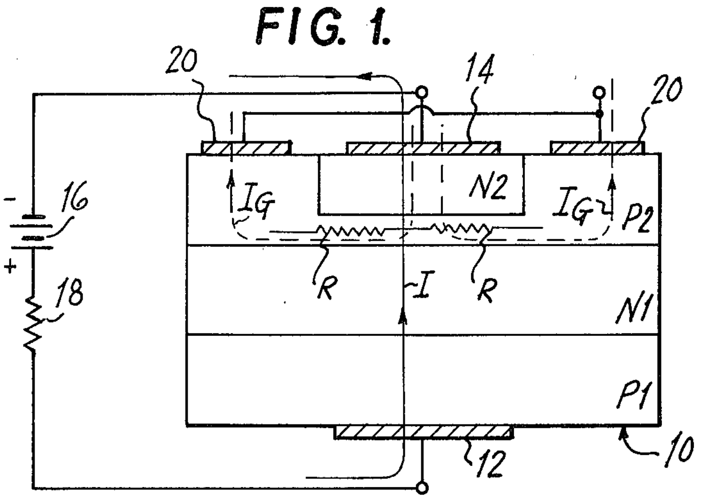

The general configuration of a prior art PNPN device is illustrated in FIG. 1 as having a succession of contiguous zones of opposite conductivity types. A first P type region P1, a first N type region N1, a second P type region P2, and a second N type region N2 are thus sandwiched together to constitute the PNPN device 10. An anode electrode 12 is attached to the P1 region and a cathode electrode 14 is attached to the N2 region. The positive terminal of an external direct current voltage source 6 is connected through a load resistor 18 to the anode 12. The negative terminal of the source 16 is connected to the cathode 14. A gate electrode 20 is attached to the P2 region.

The device is constructed by taking an N type starting material N1 and diffusing the first and second P type layers on opposite sides thereof. The second N type region is then diffused into a center portion of the surface of the second P type region. Thus the second P type region effectively surrounds the second N type region on all sides with the exception of one outer surface of the N2 region to which the cathode electrode 14 is attached.

Figure 2A:
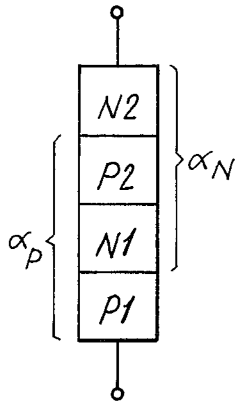
FIGS. 2A–2D, inclusive, are schematic representations of the portion of the second N type region which injects electrons into a second P type region, illustrating the decrease in this portion as a negative voltage is applied to the gate electrode.
Figure 2B:
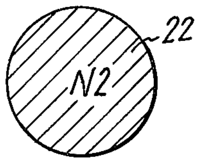
Figure 2C:
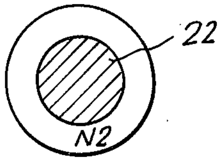
Figure 2D:
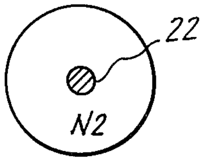

When a positive voltage is applied to the gate electrode 20, the device 10 is turned on and a forward current I begins to flow between the anode and cathode electrodes 12 and 14, respectively. When a negative potential is supplied to the gate electrode 20 a reverse biasing current IG flows from the cathode 14 to the gate electrode 20. When this current is of sufficient magnitude the entire P2-N2 junction is reversed biased and the current I will be substantially turned off. As illustrated in FIGS. 2A–2D when the negative voltage is applied to the gate electrode 20 the shaded portion of the N2 region which is injecting carriers (electrons) into the P2 region is gradually reduced until, as illustrated in FIG. 2D, the injecting portion is very small in relation to the rest of the N2 region. However, due to the internal impedance R of the device 10 the N2 region cannot be completely turned off unless an excessive reverse bias gate current is caused to flow and there is a portion away from the cathode electrode 14 which is still forward biased. At this region the electrons are still injected into the P2 region. This causes what is known as partial switching which is undesirable in a semiconductor device of this type.

If the sheet resistance of the P2 region is reduced or if the width of the N2 region between the gate electrodes is reduced then the internal impedance R will be reduced allowing the device 10 to be completely turned off. However, if the impurity density of the P2 region is increased to reduce its sheet resistance, then the injection efficiency of the N2 region into the P2 region will also be decreased. This is disadvantageous because the device is required to satisfy the condition that $\alpha_N + \alpha_P = 1$, where $\alpha_N$ and $\alpha_P$ designate the current gains of the N2-P2-N1 and the P2-N1-P1 regions, respectively, of the device 10. (See FIG. 1A). Therefore there is a limitation to reducing the sheet resistance of the P2 region.

Figure 3:
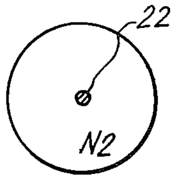
FIG. 3 is a plan view of a PNPN semiconductor device for purposes of explanation.
Figure 3:
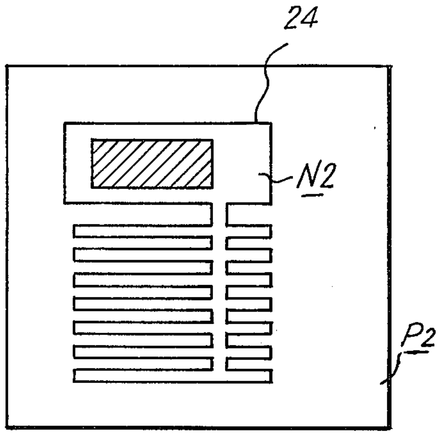
Figure 4:
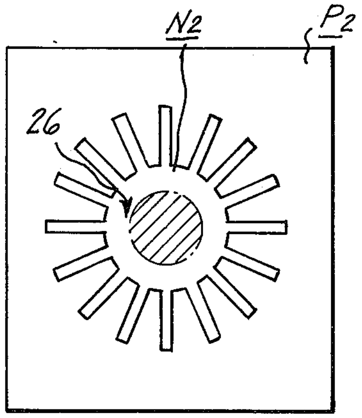
FIG. 4 is a plan view of a second PNPN device for purposes of illustration.

If the shape of the N2 region is made in the form of a comb or in the form of a star (FIGS. 3 and 4, respectively) then the narrowed N2 region is more easily turned off because less reverse gate voltage is required to penetrate into, and reverse bias the P2-N2 junction.

However, it is still necessary to bond a lead wire (the cathode) to the N2 region and this lead must carry a current as high as 500 amperes. Therefore at least a portion of the N2 region must necessarily be made big enough to receive this lead wire. This wire bonding region is designated 24 in the comb shaped N2 region of the device depicted in FIG. 3 and 26 in the star shaped N2 region of the device depicted in FIG. 4.

In either of these devices when it is desired to turn the GCS off the stripped portion of the N2 region will be turned off but the lead bonding regions 24 and 26 will not be turned off and will finally be destroyed because of the concentration of current in these portions. One of the main objects of the present invention is to overcome this defect of conventional gate controlled switches.

Referring again to FIG. 1 the GCS may be considered to comprise two parts. The first part includes the portion of the N2 region to which the lead is bonded and portions of the P2 and N1 regions which are aligned with this portion. This first part must always be in the turned off condition and therefore must satisfy the condition that $\alpha_{N1} + \alpha_{P1}$ is much less than one (but greater than zero). The second part of the GCS may be considered to include the portion of the N2 region which is not bonded to the lead and corresponding portions of the P2 and N1 regions and this must act as the active part of the GCS. The second part must satisfy the condition that $\alpha_{N2} + \alpha_{P2}$ is approximately equal to or greater than one.

Figure 5:
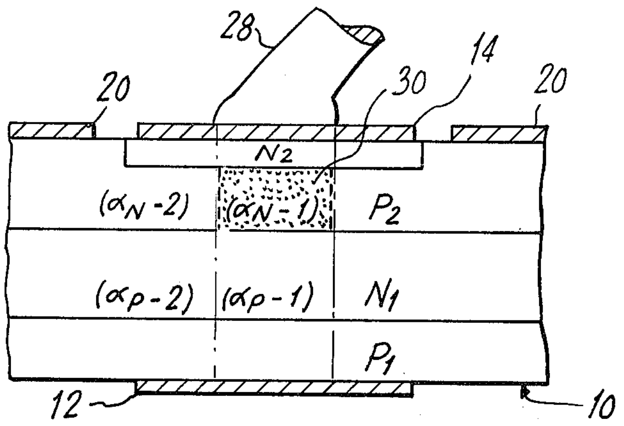
FIG. 5 is a schematic representation for use in explaining the construction of one embodiment of the invention.

Referring now more particularly to FIG. 5 one way to inactivate the first part of the GCS according to the invention is to make a portion 30 of the P2 region which is located in axial alignment with the cathode lead 28 more highly doped with an impurity than the remainder of the P2 region to thereby lower the electron injection efficiency between the corresponding portion of the N2 region and the portion 30 of the P2 region.

Figure 6:
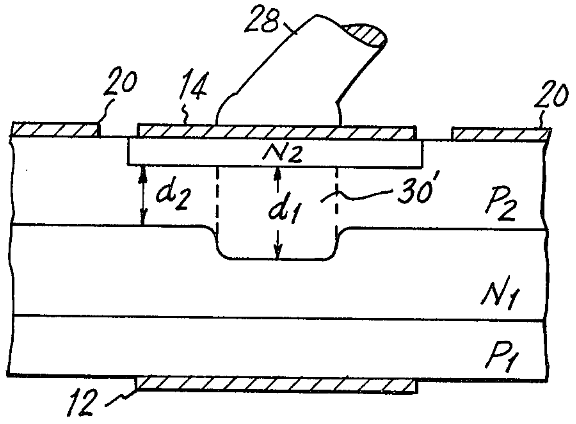
FIG. 6 is a schematic representation for use in explaining the construction of a second embodiment of the invention.

Another way to inactivate the first part of the GCS according to the invention is to make the thickness $d_1$ of a portion 30′ of the P2 region located in axial alignment with the cathode lead 28 larger than the thickness $d_2$ of the remainder of the P2 region (FIG. 6). This has the effect of reducing the current again $\alpha_{N1}$ of the NPN element made up of the portion 30′ and the corresponding, adjacent portions of the N2 and N1 regions. If the current gain of the PNP element made up of the portion 30′ and the corresponding, adjacent portions of the N1 and P1 regions is designated $\alpha_{P1}$ then $\alpha_{N1} + \alpha_{P1}$ is much less than one. Typically the dimension $d_1$ is on the order of 35 microns and $d_2$ is on the order of 30 microns.

Figure 7:
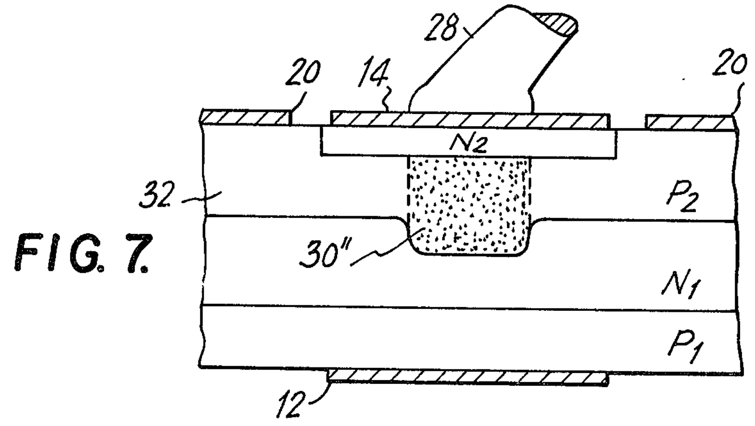
FIG. 7 is a schematic representation of a third embodiment of the invention.

In still another preferred embodiment of the invention the above two measures are combined as illustrated in FIG. 7 so that the portion 30″ of the P2 region located in axial alignment with the cathode lead 28 is doped with a greater concentration of impurities than the remainder of the P2 region and the thickness of the portion 30″ along the direction of current flow between the anode 12 and the cathode 14 is greater than the remainder of the P2 region. The magnitudes of the increased depth and the increased impurity concentration of the portion 30″ are interdependent. Thus, for example, the greater the difference in impurity concentrations the less need be the difference in the depths of the portion 30″ and the remainder of the P2 region.

Referring now more particularly to FIG. 8 one method for making the embodiment of FIG. 7 is illustrated. A flat silicon substrate of N type material 34 having an impurity density of $10^{14}$ atoms per cubic centimeter is covered on one of its flat surfaces with a mask 36 made of silicon dioxide and on its opposite surface with a covering of protective material 37. The mask 36 has an aperture 38 through which a P type impurity 40 is diffused into the layer 34 by well-known diffusion techniques (FIG. 8*b*). The P type impurity has a density of approximately $10^{19}$ atoms per cubic centimeter.

Figure 8A:
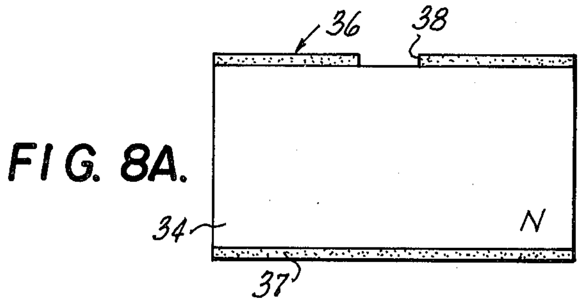
FIGS. 8A–8F are schematic representations of a method for making the embodiment of FIG. 7.
Figure 8E:
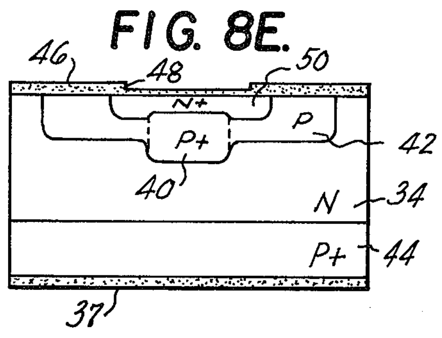
Figure 8B:
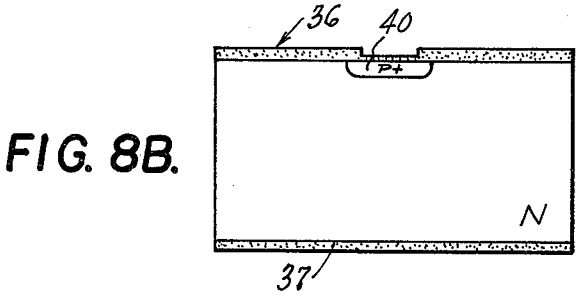
Figure 8C:
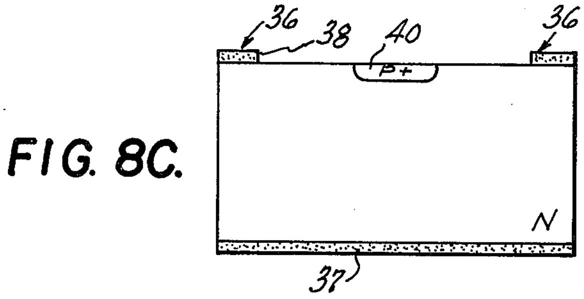
Figure 8F:
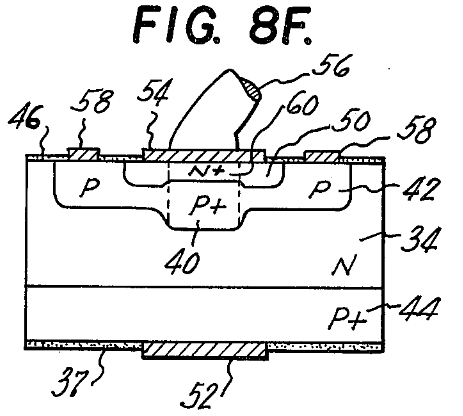
Figure 8D:
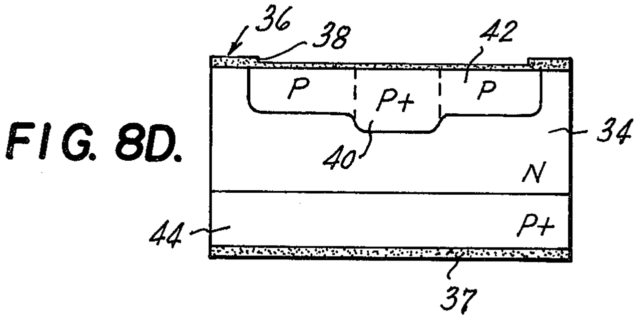

The mask 36 is thereafter partially etched away to make the aperture 38 much larger, as illustrated in FIG. 8c. A P type impurity having a density approximatley $10^{17}$ atoms per cubic centimeter is thereafter diffused into a region 42, which includes the region 40 but which is substantially broader. (FIG. 8*d*). The region 40 is also diffused with the second P type material to make it deeper along the longitudinal axis than the remaining portion of the region 42. The opposite flat surface of the substrate 34 is also provided with a P type region 44 having an impurity concentration of approximately $10^{19}$ atoms per cubic centimeter by the usual diffusion techniques.

As illustrated in FIG. 8*e*, the upper surface of the region 42 and the upper surface of the substrate 34 are next covered with a silicon dioxide mask 46 which has an aperture 48 in it. An N type material 50 in a shape of a star or a comb as shown in plan view in FIGS. 3 and 4, respectively, is diffused through the aperture 48 by the usual techniques into the area 42 and the area 40. Finally, the P type region 44 is provided with an anode electrode 52, the N type region 50 is provided with a cathode electrode 54, and a lead 56 is bonded to the electrode 54. The upper surfaces of the P type region 42 are also provided with gate electrodes 58.

As described above in reference to the embodiment of FIG. 7 the cathode lead 56 is axially aligned with the P type region 40 along the path of current flow between the cathode lead 56 and the anode 52. A portion 60 of the N2 region corresponds to the region 40 and is located between it and the cathode lead 56. By making the P type region 40 thicker along the path of main current flow than the remaining portion 42 of the P type layer and by making its impurity concentration higher, the injection efficiency of the portion 60 of the N type region 50 is so greatly reduced that the PN junction formed between the portions 60 and 40 of the GCS is shut off at all times irrespective of the polarity of the switching voltages applied to the gate electrodes 58. Thus the portion 60 of the N region directly below the lead 56 is not forced to carry an excessive amount of current during shut off of the GCS.

Although in reference to FIG. 8 one preferred embodiment is described as having an intermediate P zone having a portion which is higher in impurity concentration than the remainder of the intermediate zone and also as being thicker in that same portion than the remainder of the P zone, in other embodiments this intermediate zone may be either higher in impurity concentration or thicker but not necessarily both. Also the N type region 50 is only illustratively described as being comb shaped or star shaped and in other embodiments it may have other configurations wherein there are provided narrow N type elements with a lead bonding area having a relatively larger cross-sectional area.

It should be apparent that the invention is intended for application in NPNP devices as well as PNPN devices. In such NPNP devices the same principles as discussed above are applicable but the polarities of the semiconducting regions are changed.

The terms and expressions which have been employed here are used as terms of description and not of limitation, and there is no intention in the use of such terms and expressions, of excluding equivalents of the features shown and described, or portions thereof, it being recognized that various modifications are possible within the scope of the invention claimed.

What is claimed is:

1. A gate controlled semiconductor switch formed of a semiconductor body having successive, contiguous regions of opposite conductivity type material and being provided with opposite surfaces, said gate controlled semiconductor switch comprising an anode region; a first intermediate region overlying said anode region and defining a first PN junction; a second intermediate region diffused into said first intermediate region and forming a second PN junction; said first and second intermediate regions each having portions that extend to one of said surfaces of said semiconductor body such that said first intermediate region portion surrounds said second intermediate region and said second PN junction extends upward to said one surface and defines a closed line thereat; a select central portion of said second intermediate region being diffused deeper into said first intermediate region than the immediately adjacent surrounding portion thereof; a cathode region diffused from said one surface into said second intermediate region and forming a third PN junction such that said second intermediate region portion surrounds said cathode region, said cathode region being symmetrical with respect to said select central portion of said second intermediate region such that said third PN junction extends upward to said one surface and defines a closed interdigitated line which is circumscribed by said second PN junction, an outer portion of said cathode region being diffused deeper into said second intermediate region than the adjacent central portion thereof, said cathode region central portion and said select central portion of said second intermediate region being in axial alignment; an anode electrode connected to said anode region; a cathode electrode connected to said cathode region and being in axial alignment with said cathode region central portion and said select central portion of said second intermediate region; gate electrode means connected to said second intermediate region for supplying turn-on and turn-off control voltages to said gate controlled semiconductor switch; and an insulating layer on said one surface, overlapping said closed line second PN junction on said one surface.

2. A gate controlled semiconductor switch formed of a semiconductor body having successive, contiguous regions of opposite conductivity type material and being provided with opposite surfaces, said gate controlled semiconductor switch comprising an anode region; a first intermediate region overlying said anode and defining a first PN junction; a second intermediate region diffused into said first intermediate region and forming a second PN junction; said first and second intermediate regions each having portions that extend to one of said surfaces of said semiconductor body such that said first intermediate region portion surrounds said second intermediate region and said second PN junction extends upward to said one surface and defines a closed line thereat; a select central portion of said second intermediate region being diffused deeper into said first intermediate region than the immediately adjacent surrounding portion thereof; a cathode region diffused from said one surface into said second intermediate region and forming a third PN junction such that said second intermediate region portion surrounds said cathode region, said cathode region being symmetrical with respect to said select central portion of said second intermediate region such that said third PN junction extends upward to said one surface and defines a closed interdigitated line which is circumscribed by said second PN junction, an outer portion of said cathode region being diffused deeper into said second intermediate region than the adjacent central portion thereof, said cathode region central portion and said select central portion of said second intermediate region being in axial alignment; an anode electrode connected to said anode region; a cathode electrode connected to said cathode region and being in axial alignment with said cathode region central portion and said select central portion of said second intermediate region; gate electrode means connected to said second intermediate region for supplying turn-on and turn-off control voltages to said gate controlled semiconductor switch; an insulating layer on said one surface, overlapping said closed line second PN junction on said one surface; and wherein said select central portion of said second intermediate region has a predetermined impurity concentration which is greater than the impurity concentration of said immediately adjacent surrounding portion thereof.

* * * * *